(12) United States Patent
Toyoda et al.

(10) Patent No.: US 10,205,296 B2
(45) Date of Patent: Feb. 12, 2019

(54) SWEPT LIGHT SOURCE AND METHOD FOR CONTROLLING THE SAME

(71) Applicants: NIPPON TELEGRAPH AND TELEPHONE CORPORATION, Chiyoda-ku (JP); HAMAMATSU PHOTONICS K.K., Hamamatsu-shi (JP); NTT Advanced Technology Corporation, Kawasaki-shi (JP)

(72) Inventors: Seiji Toyoda, Atsugi (JP); Yuzo Sasaki, Atsugi (JP); Takashi Sakamoto, Atsugi (JP); Joji Yamaguchi, Atsugi (JP); Tadashi Sakamoto, Atsugi (JP); Koei Yamamoto, Hamamatsu (JP); Masatoshi Fujimoto, Hamamatsu (JP); Mahiro Yamada, Hamamatsu (JP); Shogo Yagi, Kawasaki (JP); Yukihiko Ushiyama, Kawasaki (JP); Eiichi Sugai, Kawasaki (JP); Koji Yoneyama, Kawasaki (JP); Kazuo Fujiura, Kawasaki (JP)

(73) Assignees: NIPPON TELEGRAPH AND TELEPHONE CORPORATION, Chiyoda-ku (JP); HAMAMATSU PHOTONICS K.K., Hamamatsu-shi (JP); NTT Advanced Technology Corporation, Kawasaki-shi (JP)

( * ) Notice: Subject to any disclaimer, the term of this patent is extended or adjusted under 35 U.S.C. 154(b) by 0 days.

(21) Appl. No.: 15/616,270

(22) Filed: Jun. 7, 2017

(65) Prior Publication Data
US 2017/0358899 A1    Dec. 14, 2017

(30) Foreign Application Priority Data

Jun. 8, 2016 (JP) ................................. 2016-114654

(51) Int. Cl.
*H01S 5/062* (2006.01)
*H01S 3/107* (2006.01)
(Continued)

(52) U.S. Cl.
CPC ........ *H01S 3/1075* (2013.01); *G01B 9/02004* (2013.01); *G01B 9/02091* (2013.01);
(Continued)

(58) Field of Classification Search
CPC ...... H01S 3/08009; H01S 5/142; H01S 5/143; H01S 5/141; G02F 1/29; G02F 1/292; G02F 1/293; G02F 1/31
See application file for complete search history.

(56) References Cited

U.S. PATENT DOCUMENTS

| 3,492,492 A | * | 1/1970 | Lenzo .................. G02F 1/0126 250/225 |
| 7,990,600 B2 | * | 8/2011 | Sachs .................. G02B 27/1026 359/241 |

(Continued)

FOREIGN PATENT DOCUMENTS

| JP | 2012-242612 A | | 12/2012 | |
| JP | 2013174744 A | * | 9/2013 | ............... G02F 1/03 |

(Continued)

OTHER PUBLICATIONS

Kobayashi et al., "200-kHz Swept Light Source Using a KTN Deflector and a High-Speed Optical Coherence Tomography System," Apr. 2014, NTT Technical Review, vol. 12, No. 4, 1-5.*

*Primary Examiner* — Joshua King
(74) *Attorney, Agent, or Firm* — Oblon, McClelland, Maier & Neustadt, L.L.P.

(57) ABSTRACT

Provided is a swept light source including one end surface coupled to a wavelength filter constituted of a diffraction grating and an end mirror via a light deflector and another
(Continued)

end surface including a gain medium facing an output coupling mirror and which configures a laser cavity between the end mirror and the output coupling mirror, wherein a drive voltage having an AC voltage on which a DC bias voltage is superimposed is output from a control voltage source of the light deflector to an electrode pair of an electro-optic crystal, light is radiated from a light emitter to the electro-optic crystal, and incident light from the gain medium incident along an optical axis perpendicular to a direction of an electric field formed by the control voltage is deflected in a direction parallel to the electric field, so that wavelength sweeping is performed.

11 Claims, 10 Drawing Sheets

(51) Int. Cl.
*H01S 5/14* (2006.01)
*H01S 3/08* (2006.01)
*G01B 9/02* (2006.01)

(52) U.S. Cl.
CPC .......... *H01S 3/08009* (2013.01); *H01S 3/107* (2013.01); *H01S 5/143* (2013.01); *H01S 5/06216* (2013.01); *H01S 5/141* (2013.01)

(56) References Cited

U.S. PATENT DOCUMENTS

| | | | | |
|---|---|---|---|---|
| 2001/0046353 | A1* | 11/2001 | Seki | G02B 6/13 385/50 |
| 2008/0025349 | A1* | 1/2008 | Mizutani | H01S 5/141 372/20 |
| 2008/0173801 | A1* | 7/2008 | Uduki | G01D 5/262 250/230 |
| 2009/0219378 | A1* | 9/2009 | Nakamura | G02F 1/03 347/255 |
| 2012/0044960 | A1* | 2/2012 | Goldberg | H01S 3/115 372/12 |
| 2013/0286454 | A1* | 10/2013 | Toyoda | H01S 5/141 359/199.1 |

FOREIGN PATENT DOCUMENTS

| | | | | |
|---|---|---|---|---|
| JP | 2014-202787 A | | 10/2014 | |
| JP | 2014202787 A | * | 10/2014 | ............... G02F 1/29 |
| JP | 2015-68933 A | | 4/2015 | |
| JP | 2015-142111 A | | 8/2015 | |
| WO | WO 2006/137408 A1 | | 12/2006 | |
| WO | WO 2010006337 A2 | * | 1/2010 | ............... G02F 1/03 |

* cited by examiner

SWEPT LIGHT SOURCE AND METHOD FOR CONTROLLING THE SAME

FIELD OF THE INVENTION

An aspect of the present invention relates to a swept light source and a method for controlling the same and, more particularly, to a swept light source using a KTN light deflector and a method for controlling the same.

BACKGROUND

In the field of molecular imaging, a method of detecting target molecules with high sensitivity using optical information has become a mainstay. In the method, an optical coherent tomography (OCT) apparatus capable of acquiring information in a depth direction with high resolution using low interference light is attracting attention.

In order to collect three-dimensional information in the OCT apparatus, it is necessary to scan with a light beam output from a light source called a super luminescent diode (SLD) in horizontal and vertical directions. In the OCT apparatus, a light beam output from an SLD light source via a collimator is split into reference light and measurement light by a beam splitter, and mechanical scanning with the light beam is performed in the horizontal and vertical directions using a two-axis galvanometer mirror with respect to the split measurement light. The scanning measurement light is reflected by each layer of a measurement object on which the light is input via an objective lens and returns to the beam splitter as a drive signal S. In the beam splitter, the measurement light returning as the drive signal merges with the reference light reflected and returned by a movable mirror and is input to a photodiode (PD).

In a signal processing unit of the OCT apparatus, the intensity and time lag of the measurement light are detected on the basis of an interference phenomenon caused by the merging of the measurement light and the reference light to derive a spatial positional relationship (three-dimensional information). The OCT apparatus for acquiring tomographic images using low coherence interference uses time domain optical coherence tomography (TD-OCT) and Fourier domain optical coherence tomography (FD-OCT). FD-OCT is classified into spectral domain optical coherence tomography (SD-OCT) and swept-source optical coherence tomography (SS-OCT). A method using a swept light source in SS-OCT is particularly excellent in a high-speed response and the development of various types of high-speed broadband light sources is accelerating.

Among light deflectors that change a traveling direction of light, a light deflector using a KTN ($KTa_{1-x}Nb_xO_3$ ($0<x<1$)) crystal or a KLTN ($K_{1-y}Li_yTa_{1-x}Nb_xO_3$) ($0<x<1$ and $0<Y<1$)) crystal to which lithium is added is different from a galvanometer mirror, a polygon mirror, a MEMS mirror, or the like and is a solid-state element that does not have a movable part (see, for example, PCT International Publication No. WO 2006/137408). The KTN crystal is known as a substance having a large electro-optic effect which greatly changes its refractive index when a relatively low voltage is applied. Furthermore, when Ti or Cr electrodes are used, electric charge can be injected into the KTN crystal. By using an internal electric field generated by the injected charge, it is possible to implement a high-speed wide-angle light deflector. Accordingly, in applications requiring general optical components such as lenses, prisms, and mirrors to operate at a high speed, a KTN light deflector in which the optical components are replaced with KTN crystals can be applied (see, for example, PCT International Publication No. WO 2006/137408).

In recent years, attention has been focused on a medical optical tomographic imaging system using a high-speed swept light source in which a light deflector is incorporated in an external resonator by utilizing the high speed of refractive index control in the KTN crystal or the KLTN crystal. Among the above-mentioned OCT apparatuses, the KTN light deflector is a key device for implementing a high speed and is required to operate stably with a high speed. In particular, it is important to stably obtain a necessary and sufficient maximum deflection angle.

A configuration of a light deflector using a conventional KTN crystal is illustrated in FIG. 9. Electrodes 102 and 103 are formed on an upper surface and a lower surface of a KTN crystal 101. A control voltage is applied from the control voltage source 104 between the two electrodes. Incident light 105 is incident on a left side surface of the KTN crystal 101 and is deflected in the KTN crystal 101 while traveling in a z-axis (optical axis) direction. The light changes its traveling direction in an x-axis direction and is emitted from a right side surface of the KTN crystal 101 as emitted light 106. At this time, a deflection angle $\theta$ according to the applied voltage is obtained.

A control signal according to the application of the light deflector is applied from the control voltage source 104. For example, a control signal having a shape of a sinusoidal or sawtooth wave is applied in accordance with the application of the light deflector. In order to obtain an appropriate maximum deflection angle, a drive voltage of about several hundred volts is applied to the KTN crystal 101. However, if the light deflector is controlled only by the drive voltage for causing the deflection, a problem occurs with the increase in the drive speed. That is, there is a problem that an ideal space charge control state is not implemented and the deflection angle is decreased because a movement distance of electrons injected from the electrode by the control signal is shorter than the distance between the electrodes.

To solve this problem, a control method of applying a DC bias voltage to an AC drive voltage, injecting electrons into the KTN crystal, and trapping the electrons in a trap has been proposed. In other words, by applying a DC bias voltage and constantly filling the trap in the crystal with electrons, it is possible to stably generate a distribution or inclination of an electric field in the KTN crystal, and implement stable light deflection for a long period of time (see, for example, Japanese Unexamined Patent Publication No. 2015-142111).

Examples of a drive voltage waveform of a conventional KTN light deflector are illustrated in FIG. 10A and FIG. 10B. FIG. 10A is a voltage waveform in which sinusoidal waves are superimposed on a negative DC bias voltage of a fixed voltage. Also, triangular waves and sawtooth waves can be used instead of the sinusoidal waves. Furthermore, before the application of a drive voltage having an AC voltage superimposed on a DC bias voltage, a DC voltage is applied and electrons are filled in the trap in the crystal in advance. FIG. 10B is a voltage waveform when a DC voltage is applied as a trap filling voltage before a drive voltage is applied (see, for example, Japanese Unexamined Patent Publication. No. 2015-068933).

SUMMARY

However, if a deflection operation is started by applying a DC bias voltage to an AC drive voltage, there is a problem in that time is required until a deflection angle is stabilized because time is required until the number of trapped electrons reaches a steady state.

Assuming that a density of electrons uniformly filled in a trap of a KTN crystal is $N_{trap}$, the deflection angle obtained when incident light passes through the KTN crystal is expressed by the following Equation (1) (see, for example, Japanese Unexamined Patent Publication No. 2015-068933).

$$\theta_{p-p} = 2n^3 L g_{11} e N_{trap} \varepsilon \frac{V}{d} \quad (1)$$

Parameters will be described with reference to FIG. 1. A deflection angle $\theta_{p-p}$ is a deflection width of a maximum deflection angle in an x-axis direction of emitted light 106 when sinusoidal waves are applied as the drive voltage. n is a refractive index of a KTN crystal 101, and L is a length of the KTN crystal 101 in a z-axis direction. $g_{11}$ is an electro-optic constant, e is elementary charge, and ε is a dielectric constant. V is a maximum amplitude voltage of the drive voltage, and d is a thickness of the KTN crystal in the z-axis direction. As can be seen from Equation (1), the deflection angle $\theta_{p-p}$ is proportional to the density of electrons $N_{trap}$ filled in the trap inside the KTN crystal.

If the DC bias voltage is applied to the AC drive voltage, it does not coincide completely with the above equation because the electrons are not uniformly filled in the trap, but it is known that the deflection angle correlates with the density of trapped electrons. That is, if the DC bias voltage is applied to the AC drive voltage, the deflection property is considered not to be stabilized at an early stage because injecting electrons into the trap is time-consuming.

An objective of one embodiment of the present invention is to provide a swept light source using a light deflector having a desired deflection property at an early stage and having a stable deflection property for a long period of time and a method for controlling the same.

To achieve the above-described objective, an embodiment of the present invention is a swept light source which includes one end surface coupled to a wavelength filter having a diffraction gating and an end mirror via a light deflector and another end surface including a gain medium facing an output coupling mirror and which configures a laser cavity between the end mirror and the output coupling mirror, wherein the light deflector includes an electro-optic crystal; at least one electrode pair formed on opposing surfaces of the electro-optic crystal; a control voltage source configured to output a control voltage for forming an electric field within the electro-optic crystal via the electrode pair; and a light emitter configured to radiate light to the electro-optic crystal, and wherein a drive voltage having an AC voltage on which a DC bias voltage is superimposed is output from the control voltage source to the electrode pair, light is radiated from the light emitter to the electro-optic crystal, and incident light from the gain medium incident along an optical axis approximately perpendicular to a direction of the electric field formed by the control voltage source is deflected in a direction parallel to the electric field, so that wavelength sweeping is performed.

DETAILED DESCRIPTION OF THE INVENTION

Hereinafter, embodiments of the present invention will be described in detail with reference to the drawings.

First, it will be described how electrons trapped in a trap in the KTN crystal can be excited and removed by irradiating the KTN crystal with violet light from a light emitter (for example, an LED light source). In an electro-optic crystal having a second order electro-optic effect, there is a relationship of the following Equation (2) between a density of trapped electrons $N_{trap}$ (true charge) and a refractive index distribution in the electro-optic crystal (see, for example, Japanese Unexamined Patent Publication No. 2012-242612 (Japanese Patent No. 5285120)).

$$\Delta n = -\frac{1}{2} n^3 g_{11} e^2 N_{trap}^2 \left( x - \frac{d}{2} \right)^2 \quad (2)$$

Δn is an amount of change in a refractive index, n is the refractive index, x is a coordinate in a thickness direction of the electro-optic crystal with an electrode surface of one side set to 0, and d is a thickness of the electro-optic crystal.

Figure 1:
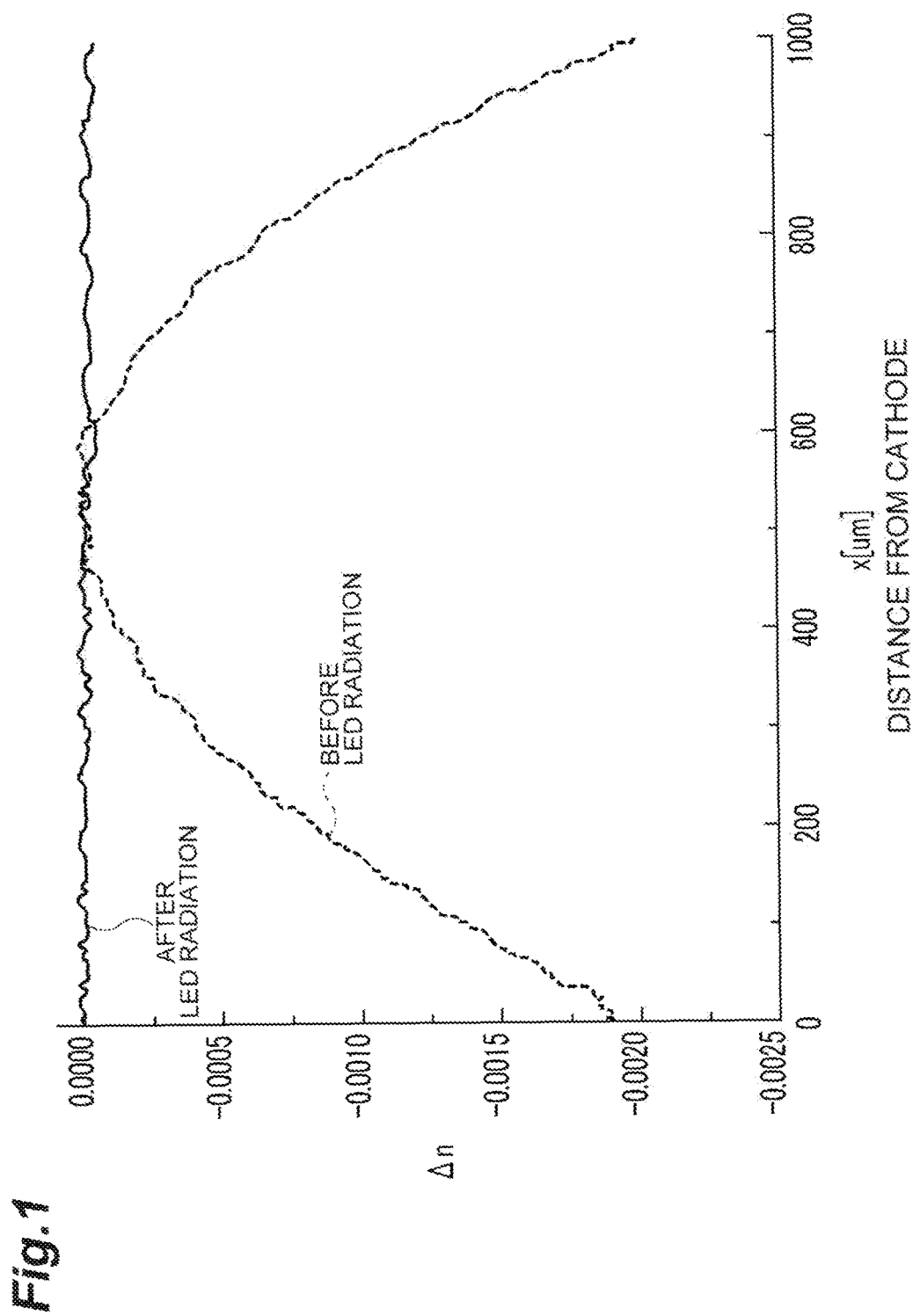
FIG. 1 is a diagram illustrating a method of obtaining a density of trapped electrons from a refractive index distribution.

FIG. 1 is a conceptual diagram illustrating a method of obtaining a density of trapped electrons from a refractive index distribution. Before the KTN crystal is irradiated with violet light from an LED light source ("before LED radiation" in FIG. 1), electrons are uniformly filled in a trap. At this time, Δn is a quadratic function with respect to x, and the density of trapped electrons $N_{trap}$ can be obtained using Equation (2). In this case, the electro-optical crystal has a lens effect, and lens power (1/f) corresponding to a reciprocal of a focal length f thereof has a value given by the following Equation (3).

$$\frac{1}{f} = n\sqrt{A} \sin(L\sqrt{A}) \quad (3)$$

Here, $A = n^2 g_{11} N_{trap}^2$, and L is a length of the electro-optic crystal. In this way, it can be seen that the lens power is stabilized if a density of trapped charge in the electro-optic crystal is stabilized, and the time stability of the trap can be evaluated if the stability of the lens power of the electro-optic crystal is evaluated.

When violet light is radiated to the electro-optic crystal from the light emitter ("after LED radiation" in FIG. 1) in a state in which electrons are uniformly filled in the trap, the refractive index distribution disappears. That is, trapped electrons are released, and electrons (true charge) are eliminated from the crystal. In this measurement, the refractive index distribution was measured in a state in which a DC bias voltage was applied to a KTN crystal for a fixed period of time and then turned off. When the KTN crystal is irradiated with violet light from the light emitter, the DC bias voltage is turned off.

From this, in the light deflector disclosed in Japanese Unexamined Patent Publication No. 2012-242612 (Japanese Patent No. 5285120), because electrons remain in the trap in, the crystal when the deflection operation is continued and thereafter variation occurs in the subsequent deflection operation, the violet light is radiated to remove electrons trapped in the trap after the deflection operation. Also, as described above, even when a direct current (DC) voltage is applied as a trap filling voltage before a drive voltage is applied, the violet light is radiated (see, for example, Japanese Unexamined Patent Publication No. 2014-202787). Because electrons trapped in the trap in the crystal are densely distributes near cathode, electrons partially excited by light radiation are rearranged so that the distribution of the electric field in the crystal becomes uniform.

On the other hand, in the present embodiment, light radiated from the light emitter is radiated simultaneously with application of the drive voltage which is an alternating current (AC) voltage on which the DC bias voltage is superimposed to the light deflector. There is a possibility that light radiation to the electro-optic crystal may excite electrons trapped in the crystal in accordance with light radiation intensity and remove the excited electrons to the outside of the electro-optic crystal. That is, because there is a possibility of the characteristics of the light deflector deteriorating, the radiation of violet light is not performed simultaneously with the application of the drive voltage in the above-described conventional light deflector.

However, if light radiation is performed while a drive voltage is applied in an electro-optic crystal such as KTN or KLTN, electrons trapped in a trap in the electro-optic crystal are partly excited by light radiation and rearranged. This is completed in an extremely short time compared with a time in which electrons captured by the trap are excited and rearranged without light radiation. Also, it is possible to supply enough injected electrons to compensate for the removed electrons if the value of the DC bias voltage is increased with respect to electrons removed by light radiation.

As described above, because light radiation can completely remove electrons from the electro-optic crystal and change an amount of injection of electric charge, it is possible to implement a deflector having a desired property by adjusting the value of the DC bias voltage and the light radiation intensity. As a result, it is possible to achieve a new effect in which a desired deflection property can be obtained at an early stage and an operation can be stably performed for a long period of time.

Figure 2:
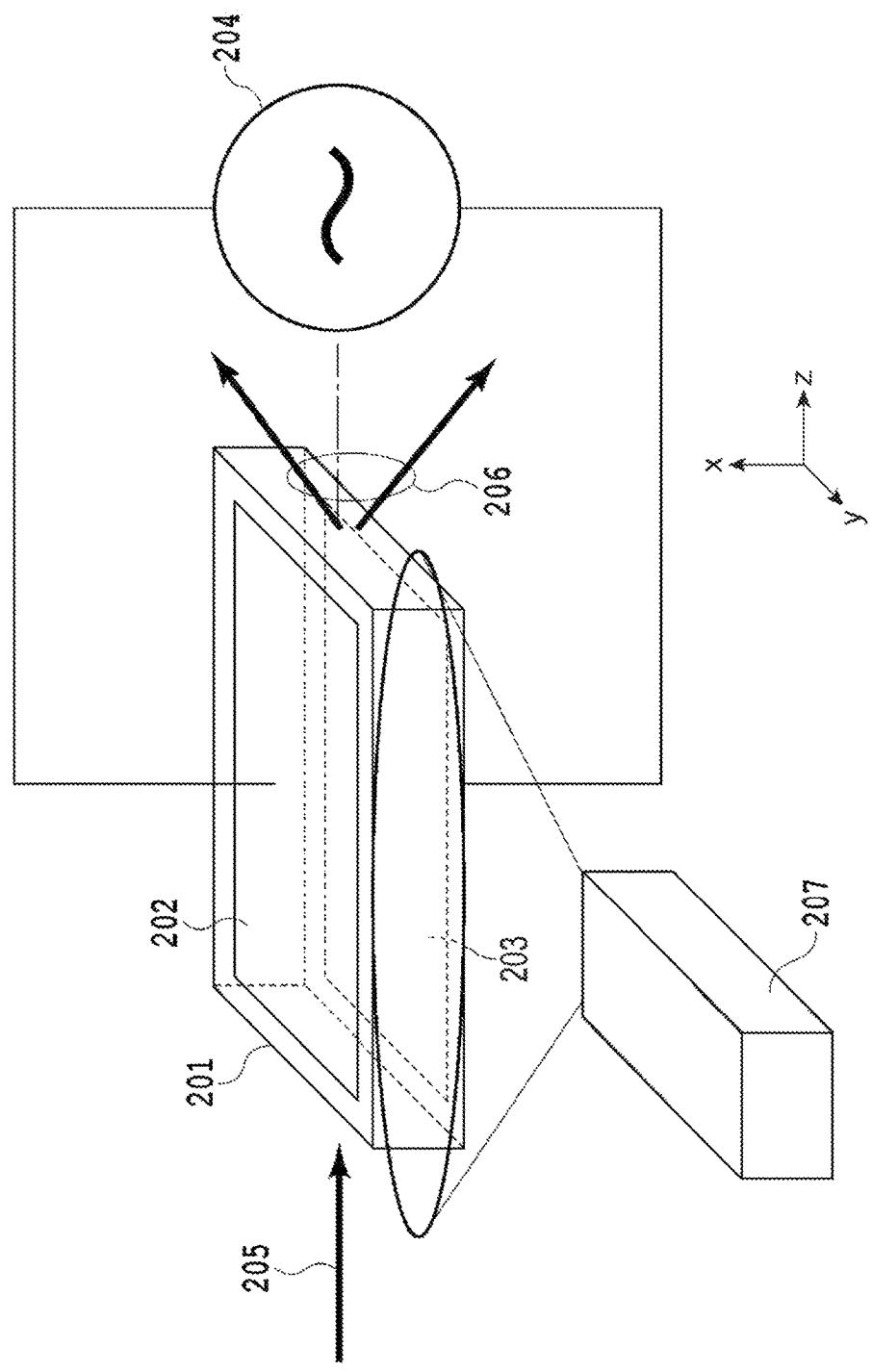
FIG. 2 is a diagram illustrating a configuration of a light deflector according to an embodiment of the present invention.

A configuration of a light deflector according to an embodiment of the present invention is illustrated in FIG. 2. Electrodes 202 and 203 are formed on upper and lower surfaces of a KTN crystal 201 which is an electro-optic crystal as an electrode pair constituted of a positive electrode and a negative electrode for generating an electric field inside the crystal. An AC drive voltage to which a DC bias voltage is applied is applied as a control signal from a control voltage source 204 between the two electrodes. Incident light 205 is incident from a left side surface (an xy plane) of the KTN crystal 201 so that the incident light 205 is orthogonal to a direction of the electric field, and is deflected in the KTN crystal 201 while traveling in a z-axis (optical axis) direction. The light changes its traveling direction in an x-axis direction and is emitted from a right side surface of the KTN crystal 201 as emitted light 206. Furthermore, a light emitter 207 for radiating violet light having a wavelength of 405 nm is arranged at a position separated 10 mm from the side surface (xz plane) along the optical axis of the KTN crystal 201.

Figure 3:
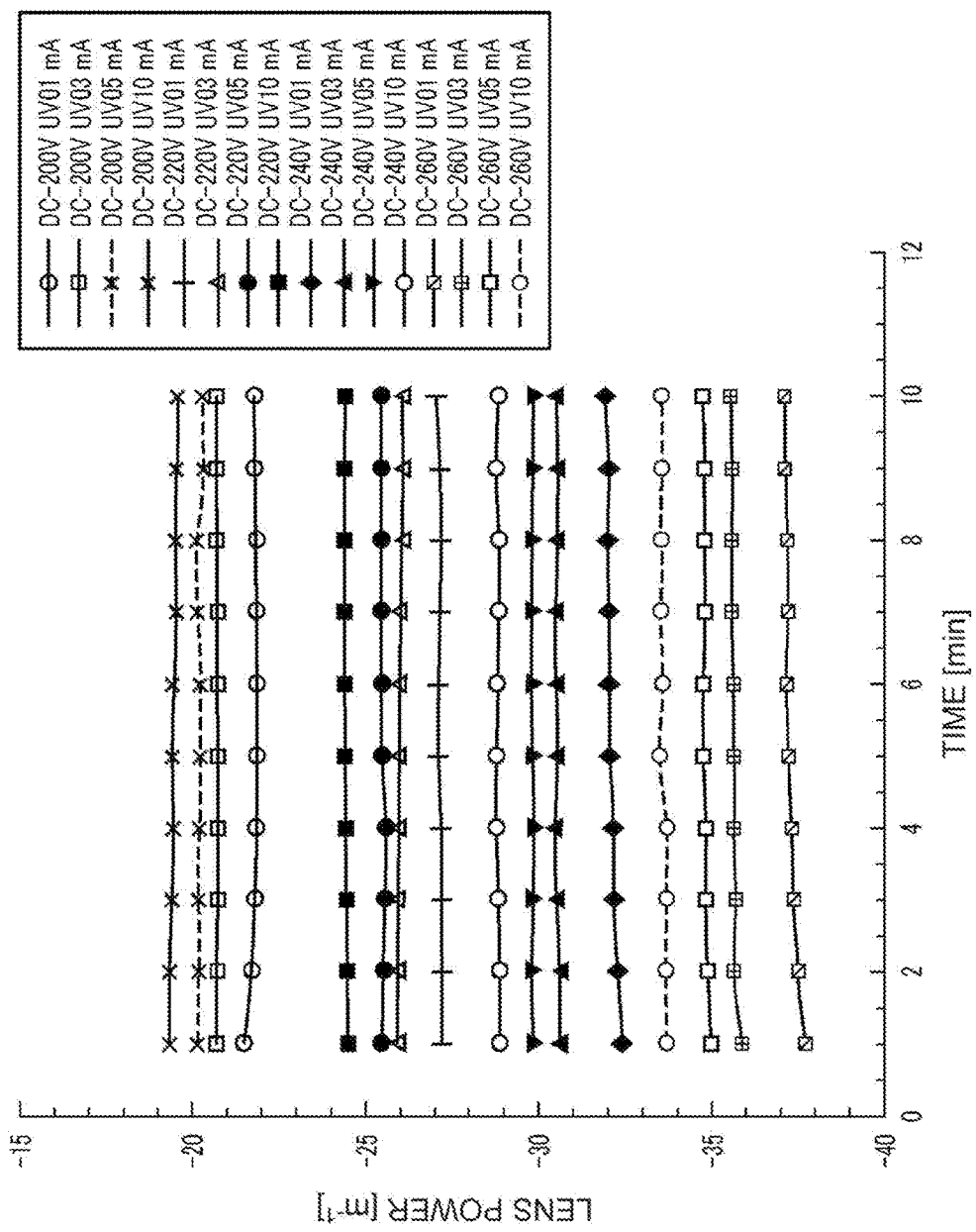
FIG. 3 is a diagram illustrating the dependency of lens power on DC bias voltage and light radiation intensity.

A change in lens power with respect to time when violet light is radiated by the light emitter while a DC bias voltage is applied to the electro-optic crystal is illustrated in FIG. 3. The DC bias voltage (a voltage value [V] indicated by reference sign "DC-" of the legend) and a current value for driving the light emitter (a current value [mA] indicated by a reference sign "UV" of the legend) are changed. Immediately after the application of the DC bias voltage, it can be seen that the dependency of lens power on time is substantially absent and the light deflector is stabilized. Also, it can be seen that lens power can be changed when a DC bias voltage and a current value for driving the light emitter 207 are changed and optimum lens power can be selected in a resonator.

Also, if a wavelength tunable light source of a 1.3 μm band in the communication wavelength band is constructed using light having a wavelength shorter than the wavelength of incident light incident on the electro-optic crystal, it is only necessary to use violet light as light radiated from the light emitter 207. As the light emitter, for example, an LED light source, an LD light source, a tungsten lamp, a deuterium lamp, a mercury lamp, a xenon lamp, a halogen lamp, or the like can be used. Also, it is preferable to install a scatterer between the light emitter and the KTN crystal so that the side surface of the KTN crystal can be uniformly irradiated with light. In a diffusion method, a diffusion lens may be used, and the side surface of the KTN crystal may be sanded to effect scattering.

Example 1

Figure 4:
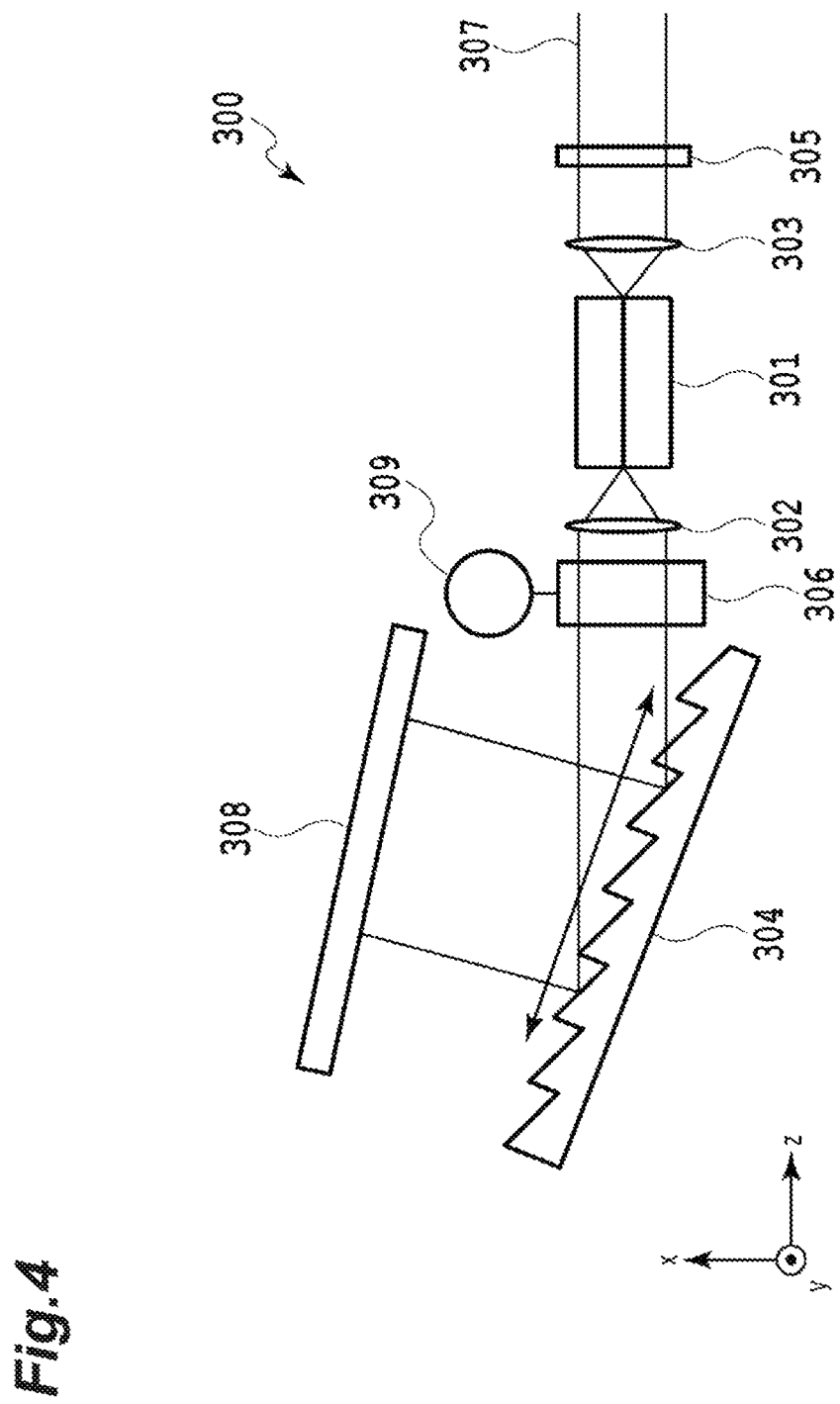
FIG. 4 is a diagram illustrating a configuration of a swept light source according to Example 1 of the present invention.

A configuration of a swept light source according to Example 1 of the present invention is illustrated in FIG. 4. This wavelength tunable light source is a configuration that switches an oscillation wavelength by changing a traveling direction of light in the KTN light deflector, and represents a so-called Littman type swept light source. In this wavelength tunable light source, a semiconductor optical amplifier (SOA) is used as a gain medium. Hereinafter, a configuration and operation of the wavelength tunable light source will be described.

In a wavelength tunable light source 300, a gain medium 301 is arranged between a focusing lens 303 and a collimator lens 302. The gain medium 301 is coupled to a wavelength filter including a diffraction grating 304 and a direct incidence end mirror 308 via the collimator lens 302 and an electro-optic deflector 306. The focusing lens 303 faces an output coupling mirror 305. A laser cavity having the output coupling mirror 305 and the end mirror 308 as both end portions is configured. Emitted light 307 is obtained from the output coupling mirror 305 through laser action of the laser cavity. A wavelength of the emitted light 307 can be varied by changing the traveling direction of the light in the electro-optic deflector 306 and changing an incident angle θ for the diffraction grating 304 which is a wavelength dispersion element.

Wavelength selection of the emitted light 307 is performed according to a voltage of a control voltage source 309 connected to the electro-optic deflector 306. This is performed by controlling a voltage applied to the electro-optic deflector 306 and changing an electric field in the x-axis direction in FIG. 6 (a direction perpendicular to the optical axis (z-axis) of the emitted light 307). That is, a change in the refractive index is induced in the electro-optic deflector 306 due to the electric field applied to the electro-optic deflector 306. As a result, when a light beam output from the gain medium 301 to the diffraction grating 304 passes through the electro-optic deflector 306, the light beam is bent toward a higher refractive index and an incident angle of the light beam for the diffraction grating 304 is changed. In this way, by changing the drive voltage for the electro-optic deflector 306, a high-speed wavelength change is implemented without intervention of a movable part.

As the collimator lens 302 and the focusing lens 303, aspheric lenses were used. As the electro-optic deflector 306, a KTN light deflector using a rectangular KTN crystal chip having an electrode interval of 1.2 mm was used. A size of the KTN crystal chip was processed to be 4.0×3.2×1.2 mm$^3$, and an electrode film made of Ti/Pt/Au was deposited on a 4.0×3.2 mm$^2$ surface. Temperature is controlled so that the dielectric constant of the KTN crystal chip is 17,500 in a cubic region. After the temperature control, a drive voltage is applied from the control voltage source 309 to the KTN crystal chip. The incidence and emission end surfaces of the KTN light deflector have both a reflective film and an antireflective film and light is emitted after being reflected twice in the KTN crystal. With such a configuration, an effective crystal length is 12 mm. A diameter of the tight beam at the incidence and emission end surfaces is set to 1.0 mm, and linearly polarized light parallel to the electric field is incident on the KTN crystal chip.

An AC voltage on which a DC bias voltage is superimposed is applied to the KTN light deflector as will be described below. Thus, an emission angle of the emitted light from the KTN light deflector is deflected according to the application of the DC bias voltage around a predetermined angle. That is, the emission angle of the emitted light of the KTN light deflector has an offset of the predetermined angle. Therefore, it is only necessary to perform arrangement of the diffraction grating inclined by the offset angle rather than conventional arrangement of the light deflector and the diffraction grating (see, for example, Japanese Unexamined Patent Publication No. 2015-142111).

The light emitted from the electro-optic deflector 306 is incident on the diffraction grating 304 having a groove density of 600 mm$^{-1}$ and a blaze wavelength of 1.6 µm. In the light diffracted by the diffraction grating 304, a wavelength returned to the laser resonator by the end mirror 308 is oscillated. Voltage conditions applied to the KTN light deflector are as follows. A light emitter (not illustrated) included in the electro-optic deflector 306 has an LED light source having a peak wavelength of 405 nm, and continuously radiates violet light to the KTN crystal chip at a drive current value of 3 mA. An AC voltage (amplitude 300 V) of 20 kHz on which a DC bias voltage of 300 V is superimposed is applied from the control voltage source 309 and the electro-optic deflector 306 is operated as a high-speed deflector. That is, simultaneously with output of the drive voltage from the control voltage source 309, the KTN crystal chip is irradiated with violet light from the light emitter.

Figure 5:
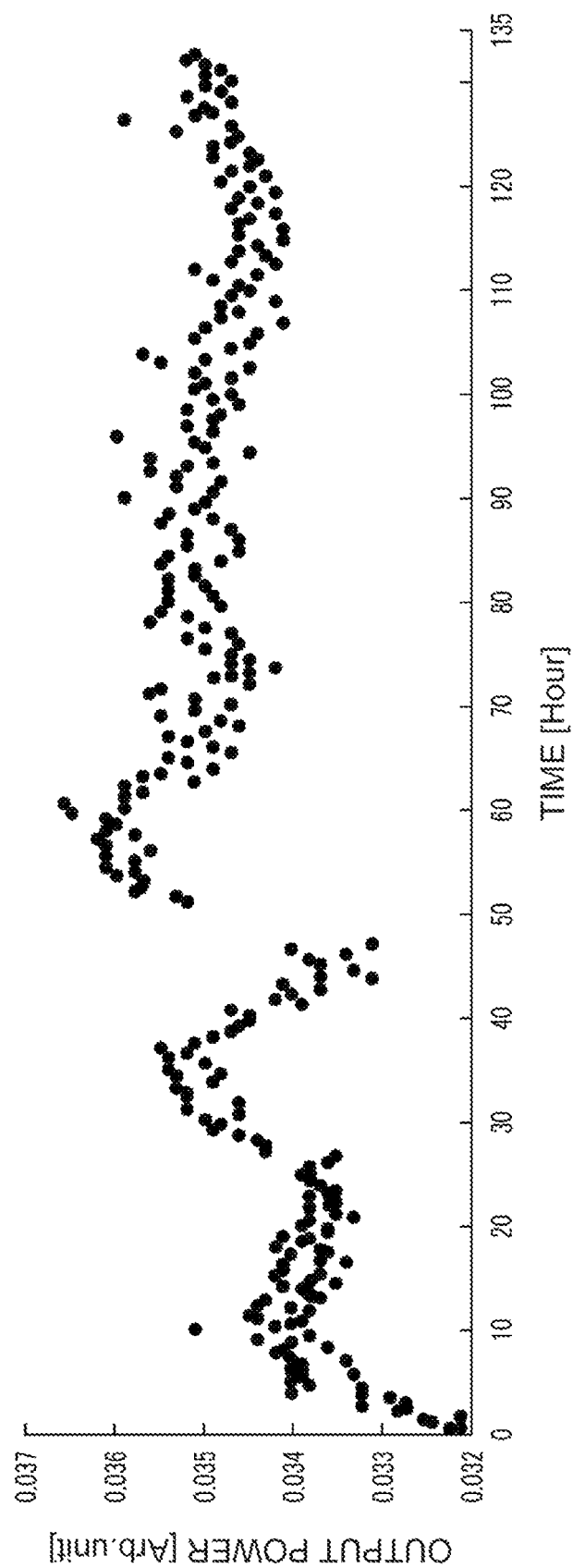
FIG. 5 is a diagram illustrating the dependency of power of a resonator in the swept light source on time.

The dependency of power of the resonator in the swept light source on time is illustrated in FIG. 5. It was found that a substantially constant value was obtained and the time variation was small as a result of measuring light output across 130 hours or more from the start of the operation of the swept light source. If necessary, a voltage for adjusting a density of trapped electrons in the KTN crystal may be applied for a desired time before the control voltage for the light deflection operation is applied.

Example 2

Figure 6:
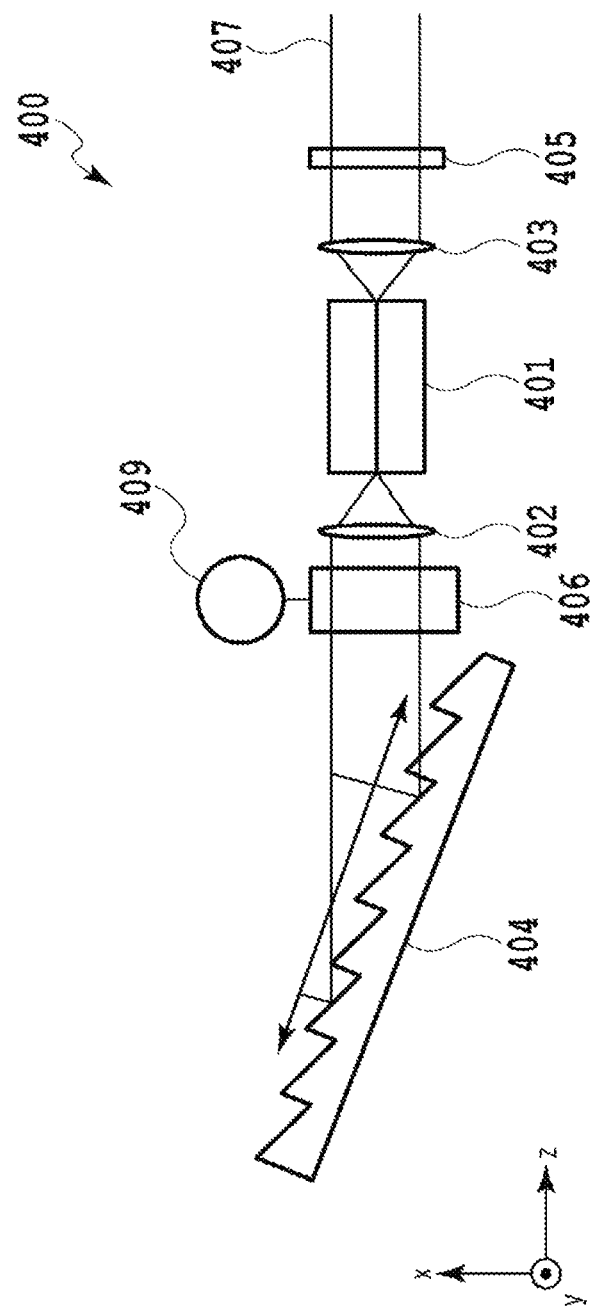
FIG. 6 is a diagram illustrating a configuration of a swept light source according to Example 2 of the present invention.

A configuration of a swept light source according to Example 2 of the present invention is illustrated in FIG. 6. This wavelength tunable light source also has a configuration of switching an oscillation wavelength by changing the traveling direction of light with the KTN light deflector, and is a so-called Littrow type swept light source. In this wavelength tunable light source, a semiconductor optical amplifier (SOA) is used as a gain medium. Hereinafter, the configuration and operation of the wavelength tunable light source will be described.

In the wavelength tunable light source 400, a gain medium 401 is arranged between a focusing lens 403 and the collimator lens 402. The gain medium 401 is coupled to a wavelength filter including a diffraction grating 404 via the collimator lens 402 and an electro-optic deflector 406. The diffraction grating 404 generates first-order diffracted light and non-diffracted light, the first-order diffracted light is fed back to the gain medium 401, and a resonator is formed between the output coupling mirror 405 and the diffraction grating 404 via the focusing lens 403. Emitted light 407 is obtained from the output coupling mirror 405 through laser action of the laser cavity. The wavelength of the emitted light 407 can be varied by changing the traveling direction of the light by the electro-optic deflector 406 and changing an incident angle θ for the diffraction grating 404 which is a wavelength dispersion element.

The wavelength selection of the emitted light 407 is performed according to voltage control of the control voltage source 409 as in Example 1.

As the collimator lens 402 and the focusing lens 403, aspheric lenses were used. As the electro-optic deflector 406, a KTN light deflector using a rectangular KTN crystal chip having an electrode interval of 1.2 mm was used. A size of the KTN crystal chip was processed to be 4.0×3.2×1.2 mm$^3$, and an electrode film made of Ti/Pt/Au was deposited on a 4.0×3.2 mm$^2$ surface. Temperature is controlled so that the dielectric constant of the KTN crystal chip is 17,500 in a cubic region. After the temperature control, a drive voltage is applied from the control voltage source 409 to the KTN crystal chip. The incidence and emission end surfaces of the KTN light deflector have both a reflective film and an antireflective film and light is emitted after being reflected twice in the KTN crystal. With such a configuration, an effective crystal length is 12 mm. A diameter of the light beam at the incidence and emission end surfaces is set to 1.0 mm, and linearly polarized light parallel to the electric field is incident on the KTN crystal chip.

An AC voltage on which a DC bias voltage is superimposed is applied to the KTN light deflector as will be described below. Thus, an emission angle of an output light from the KTN light deflector is deflected according to the application of the DC bias voltage around a predetermined angle. That is, the emission angle of the output light of the KTN light deflector has an offset of the predetermined angle. Therefore, it is only necessary to perform arrangement of the diffraction grating inclined by the offset angle rather than conventional arrangement of the light deflector and the diffraction grating.

The light emitted from the electro-optic deflector 406 is incident on a diffraction grating having a groove density of 1200 mm$^{-1}$ and a blaze wavelength of 1.6 µm. In the light diffracted by the diffraction grating 404, the wavelength of the first-order diffracted light fed back into the laser resonator is oscillated. The drive voltage conditions for the KTN light deflector are as follows. A light emitter (not illustrated) included in the electro-optic deflector 406 has an LED light source having a peak wavelength of 405 nm, and continuously radiates violet light to the KTN crystal chip at a drive current value of 3 mA. An AC voltage (amplitude 300 V) of 20 kHz on which a DC bias voltage of 300 V is superimposed is applied from the control voltage source 409 and the electro-optic deflector 406 is operated as a high-speed deflector. That is, simultaneously with output of the drive voltage from the control voltage source 409, the KTN crystal chip is irradiated with violet light from the light emitter.

As in Example 1, it was found that a substantially constant value was obtained and the time variation was small as a result of measuring light output across 130 hours or more from the start of the operation of the swept light source. If necessary, a voltage for adjusting a density of trapped electrons in the KTN crystal may be applied for a desired time before the control voltage for the light deflection operation is applied.

Example 3

As in Example 2, the Littrow type swept light source illustrated in FIG. 6 was constructed to be a wavelength tunable light source of a 1.3 µband.

A semiconductor optical amplifier (SOA) is used as a gain medium. As the collimator lens 402 and the focusing lens 403, aspheric lenses were used. As the electro-optic deflector 406, a KTN light deflector using a rectangular KTN crystal chip having an electrode interval of 1.2 mm was used. A size of the KTN crystal chip was processed to be 4.0×3.2×1.2 mm$^3$, and an electrode film made of Ti/Pt/Au was deposited on a 4.0×3.2 mm$^2$ surface. Temperature is controlled so that the dielectric constant of the KTN crystal chip is 17,500 in a cubic region. After the temperature control, a drive voltage is applied from the control voltage source 409 to the KTN crystal chip. The incidence and emission end surfaces of the KTN light deflector have both a reflective film and an antireflective film and light is emitted after being reflected twice in the KTN crystal. With such a configuration, an effective crystal length is 12 mm. A diameter of the light beam at the incidence and emission end surfaces is set to 1.0 mm, and linearly polarized light parallel to the electric field is incident on the KTN crystal chip.

An AC voltage on which a DC bias voltage is superimposed is applied to the KTN light deflector as will be described below. Thus, an emission angle of the output light from the KTN light deflector is deflected according to the application of the DC bias voltage around a predetermined angle. That is, the emission angle of the output light of the KTN light deflector has an offset of the predetermined angle. Therefore, it is only necessary to perform arrangement of the diffraction grating inclined by the offset angle rather than conventional arrangement of the light deflector and the diffraction grating.

The light emitted from the electro-optic deflector 406 is incident on a diffraction grating having a groove density of 1200 mm$^{-1}$ and a blaze wavelength of 1.6 µm. In the light diffracted by the diffraction grating 404, the wavelength of the first-order diffracted light fed back into the laser resonator is oscillated. The drive voltage conditions for the KTN light deflector are as follows.

Figure 7:
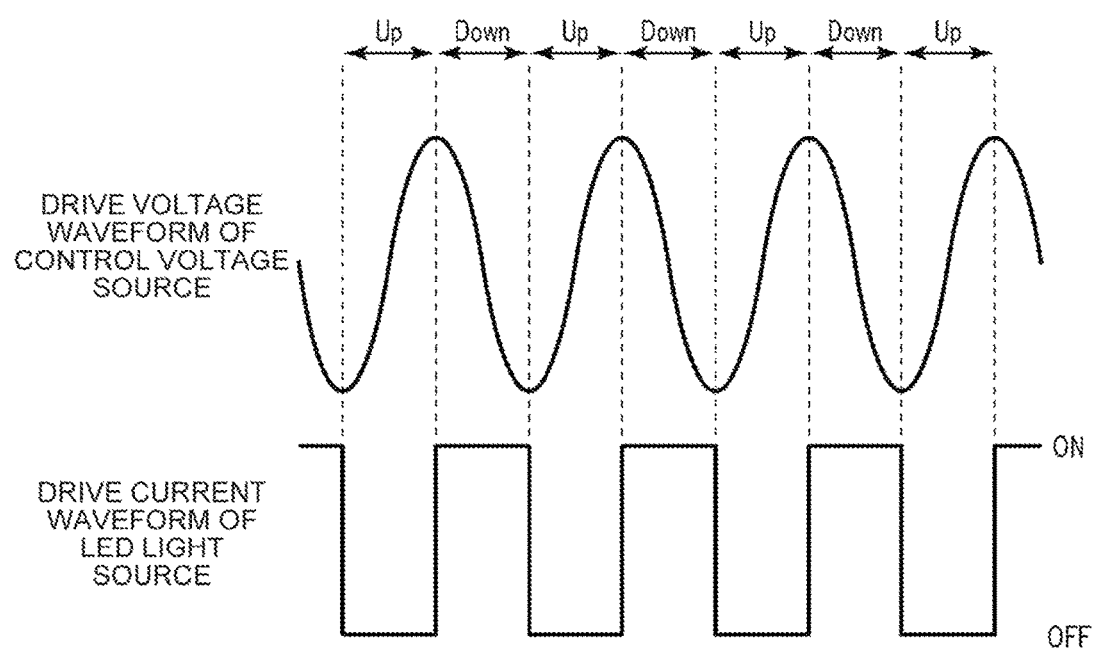
FIG. 7 is a diagram illustrating timings of application of a drive voltage from a control voltage source and light radiation from a light emitter in Example 3.

Timings of the application of the drive voltage from the control voltage source and the light radiation from the light emitter in Example 3 are illustrated in FIG. 7. A light radiation time from an LED light source having a peak wavelength of 405 nm used as the light emitter included in the electro-optic deflector 406 and a timing of the drive voltage from the control voltage source to the KTN light deflector are adjusted. In a downward sweep time zone (a time zone indicated by "Down" in FIG. 7), violet light is continuously radiated by driving the LED light source at a drive current value of 3 mA in which the sinusoidal wave changes from a maximum value to a minimum value in the drive voltage waveform from the control voltage source to the KTN light deflector and radiation from the LED light source is stopped in an upward sweep time zone (a time zone indicated by "Up" in FIG. 7) in which the sinusoidal wave changes from a minimum value to a maximum value. As the drive voltage from the control voltage source 409, an AC voltage (amplitude 300 V) of 20 kHz on which a DC bias voltage of 300 V is superimposed is applied. That is, violet light is irradiated from the light emitter to the KTN crystal chip only during a cycle which is half of a cycle of the AC voltage.

According to such a control method, it is possible to suppress a change in a property of KTN due to LED radiation while maintaining a stable deflection property for a long period of time and simultaneously achieving a desired deflection property at an early stage. It was found that a substantially constant value was obtained and the time variation was small as a result of measuring light output across 130 hours or more from the start of the operation of the swept light source. If necessary, a voltage for adjusting a density of trapped electrons in the KTN crystal may be applied for a desired time before the control voltage for the light deflection operation is applied.

Example 4

As in Example 2, the Littrow type swept light source illustrated in FIG. 6 was constructed to be a wavelength variable light source of a 1.3 µm band.

A semiconductor optical amplifier (SOA) is used as a gain medium. As the collimator lens 402 and the focusing lens 403, aspheric lenses were used. As the electro-optic deflector 406, a KTN light deflector using a rectangular KTN crystal chip having an electrode interval of 1.2 mm was used. A size of the KTN crystal chip was processed to be 4.0×3.2×1.2 mm$^3$, and an electrode film made of Ti/Pt/Au was deposited on a 4.0×3.2 mm$^2$ surface. Temperature is controlled so that the dielectric constant of the KTN crystal chip is 17,500 in a cubic region. After the temperature control, a drive voltage is applied from the control voltage source 409 to the KTN crystal chip. The incidence and emission end surfaces of the KTN light deflector have both a reflective film and an antireflective film and light is emitted after being reflected twice in the KTN crystal. With such a configuration, an effective crystal length is 12 mm. A diameter of the light beam at the incidence and emission end surfaces is set to 1.0 mm, and linearly polarized light parallel to the electric field is incident on the KTN crystal chip.

An AC voltage on which a DC bias voltage is superimposed is applied to the KTN light deflector as will be described below. Thus, an emission angle of the output light from the KTN light deflector is deflected according to the application of the DC bias voltage around a predetermined angle. That is, the emission angle of the output light of the KTN light deflector has an offset of the predetermined angle. Therefore, it is only necessary to perform arrangement of the diffraction grating inclined by the offset angle rather than conventional arrangement of the light deflector and the diffraction grating.

The light emitted from the electro-optic deflector 406 is incident on a diffraction grating having a groove density of 1200 mm$^{-1}$ and a blaze wavelength of 1.6 μm. In the light diffracted by the diffraction grating 404, the wavelength of the first-order diffracted light fed back into the laser resonator is oscillated. The drive voltage conditions for the KTN light deflector are as follows.

Figure 8:
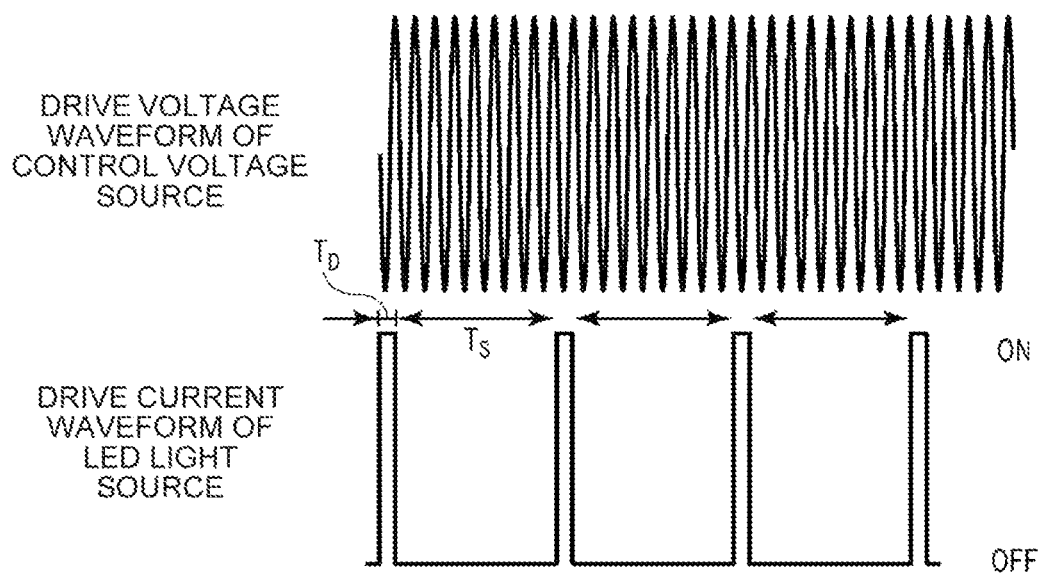
FIG. 8 is a diagram illustrating timings of application of a drive voltage from a control voltage source and light radiation from a light emitter in Example 4.
Figure 9:
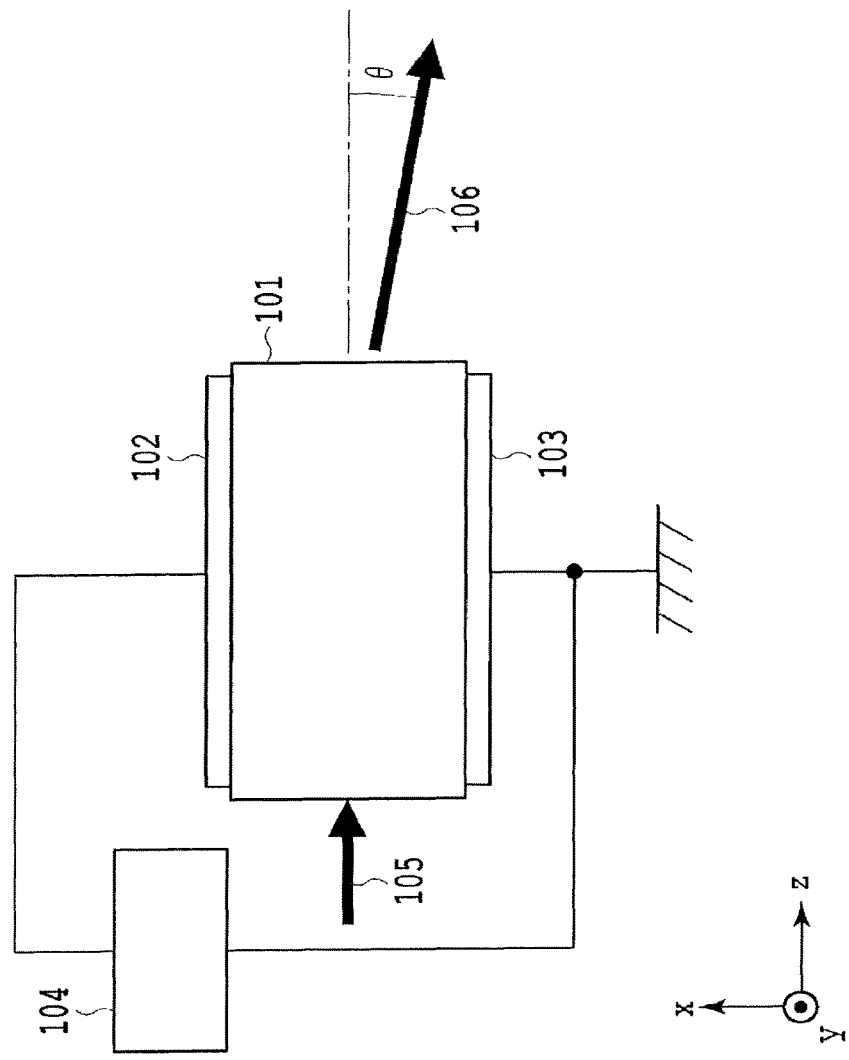
FIG. 9 is a diagram illustrating a configuration of a light deflector using a conventional KTN crystal.
Figure 10A:
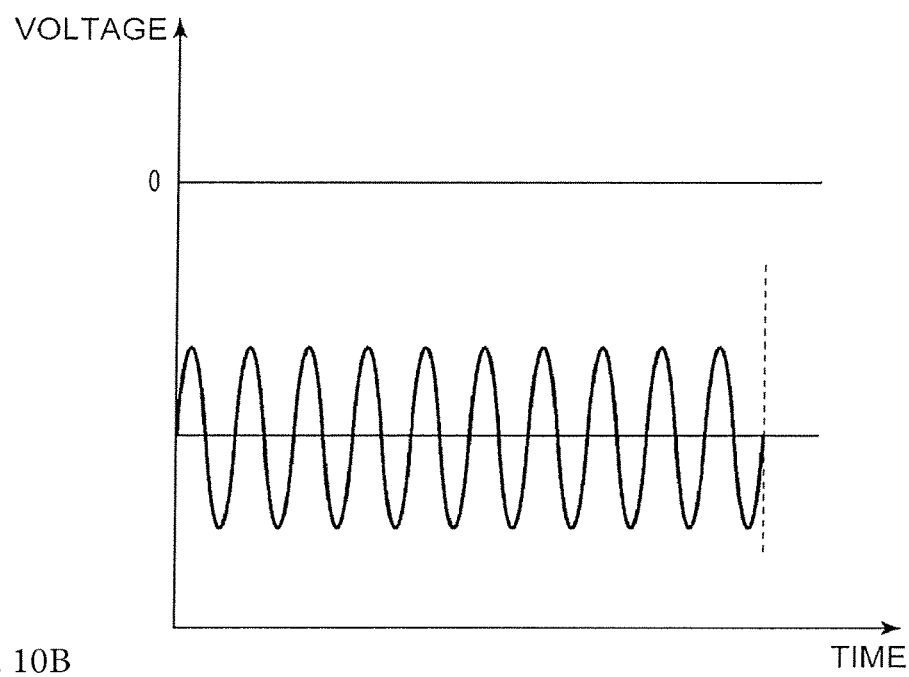
FIG. 10A and FIG. 10B are diagrams illustrating examples of a drive voltage waveform of a conventional KTN light deflector.
Figure 10B:
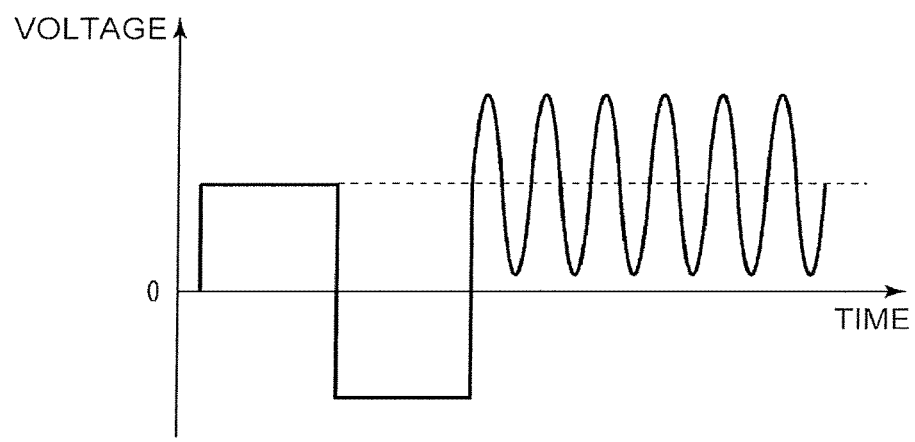

Timings of the application of the drive voltage from the control voltage source and the light radiation from the light emitter in Example 4 are illustrated in FIG. 8. A time of light radiation from the LED light source having the peak wavelength of 405 nm used as the light emitter included in the electro-optic deflector 406 and a timing of the drive voltage from the control voltage source to the KTN light deflector are adjusted. In order to drive the KTN light deflector, pulsed violet light is radiated from the light emitter by driving the LED light source at a pulse current maximum value of 3 mA simultaneously with the application of a control voltage from the control voltage source and then pulsed violet light is radiated at fixed time intervals. In accordance with an amount of change in the allowable deflection property, a time for irradiating the pulsed violet light (a time indicated by "$T_D$" in FIG. 8) and an interval for irradiating the pulsed violet light (an interval indicated by "$T_S$" in FIG. 8) are adjusted. For example, the time $T_D$ for irradiating the pulsed violet light may be several milliseconds (msec) and the interval $T_S$ for irradiating the pulsed violet light may be about several hours.

With such a control method, it is possible to suppress a change in a property of KTN due to LED radiation while maintaining a stable deflection property during a long period of time and simultaneously achieving a desired deflection property at an early stage. It was found that a substantially constant value was obtained within a period in which pulsed violet light is not radiated as a result of measuring light output across 130 hours or more from the start of the operation of the swept light source. If necessary, a voltage for adjusting a density of trapped electrons in the KTN crystal may be applied for a desired time before the control voltage for the light deflection operation is applied.

According to the embodiment described above, it is possible to cause a swept light source to reach a desired property at an early stage and cause an operation to be stably performed for a long period of time because it is possible to shorten a time until electron injection into a trap reaches a steady state by radiating light from the light emitter during voltage application to an electro-optic crystal.

What is claimed is:

1. A swept light source which includes one end surface coupled to a wavelength filter having a diffraction grating and an end mirror via a light deflector and another end surface including a gain medium facing an output coupling mirror and which configures a laser cavity between the end mirror and the output coupling mirror,
wherein the light deflector includes
an electro-optic crystal;
at least one electrode pair formed on opposing surfaces of the electro-optic crystal;
a control voltage source configured to output a control voltage for forming an electric field within the electro-optic crystal via the electrode pair; and
a light emitter configured to radiate light to the electro-optic crystal, and
wherein the control voltage source outputs a drive voltage having an AC voltage on which a DC bias voltage is superimposed to the electrode pair,
the light emitter radiates light to the electro-optic crystal simultaneously with outputting the drive voltage, and
incident light from the gain medium incident along an optical axis perpendicular to a direction of the electric field formed by the control voltage is deflected in a direction parallel to the electric field, so that wavelength sweeping is performed.

2. The swept light source according to claim 1, wherein the light emitter radiates the light to the electro-optic crystal only during a cycle which is half of a cycle of the AC voltage in a waveform of the AC voltage of the control voltage output from the control voltage source.

3. The swept light source according to claim 1, wherein the light emitter radiates pulsed light to the electro-optic crystal at fixed time intervals simultaneously with output of the drive voltage from the control voltage source to the electrode pair.

4. The swept light source according to claim 1, wherein a wavelength of light radiated from the light emitter is shorter than a wavelength of the incident light.

5. The swept light source according to claim 1, wherein the electro-optic crystal is either a KTN ($KTa_{1-x}Nb_xO_3$ ($0<x<1$)) crystal or a KLTN ($K_{1-y}Li_yTa_{1-x}Nb_xO_3$) ($0<x<1$ and $0<y<1$)) crystal.

6. A swept light source which includes one end surface coupled to a wavelength filter having a diffraction grating via a light deflector and another end surface including a gain medium facing an output coupling mirror and which configures a laser cavity between the diffraction grating and the output coupling mirror,
wherein the light deflector includes
an electro-optic crystal;
at least one electrode pair formed on opposing surfaces of the electro-optic crystal;
a control voltage source configured to output a control voltage for forming an electric field within the electro-optic crystal via the electrode pair; and
a light emitter configured to radiate light to the electro-optic crystal, and
wherein the control voltage source outputs a drive voltage having an AC voltage on which a DC bias voltage is superimposed to the electrode pair,
the light emitter radiates light to the electro-optic crystal simultaneously with outputting the drive voltage, and
incident light from the gain medium incident along an optical axis perpendicular to a direction of the electric field formed by the control voltage is deflected in a direction parallel to the electric field, so that wavelength sweeping is performed.

7. The swept light source according to claim 6, wherein the light emitter radiates the light to the electro-optic crystal only during a cycle which is half of a cycle of the AC voltage in a waveform of the AC voltage of the control voltage output from the control voltage source.

8. The swept light source according to claim 6, wherein the light emitter radiates pulsed light to the electro-optic crystal at fixed time intervals simultaneously with output of the drive voltage from the control voltage source to the electrode pair.

9. The swept light source according to claim 6, wherein a wavelength of light radiated from the light emitter is shorter than a wavelength of the incident light.

10. The swept light source according to claim 6, wherein the electro-optic crystal is either a KTN ($KTa_{1-x}Nb_xO_3$ ($0<x<1$)) crystal or a KLTN ($K_{1-y}Li_yTa_{1-x}Nb_xO_3$) ($0<x<1$ and $0<y<1$)) crystal.

11. A method for controlling a swept light source which includes one end surface coupled to a wavelength filter via a light deflector and another end surface including a gain medium facing an output coupling mirror and which configures a laser cavity between the wavelength filter and the output coupling mirror, wherein the light deflector includes an electro-optic crystal; at least one electrode pair formed on opposing surfaces of the electro-optic crystal; a control voltage source configured to output a control voltage for forming an electric field within the electro-optic crystal via the electrode pair; and a light emitter configured to radiate light to the electro-optic crystal, the method comprising:

injecting electrons into the electro-optic crystal by outputting a drive voltage having an AC voltage on which a DC bias voltage is superimposed from the control voltage source to the electrode pair;

varying an amount of charge injected into the electro-optic crystal by radiating light from the light emitter to the electro-optic crystal and exciting electrons trapped in a trap of the electro-optic crystal; and obtaining a desired deflection property by adjusting the drive voltage from the control voltage source and a light radiation time from the light emitter, wherein the control voltage source outputs a drive voltage having an AC voltage on which a DC bias voltage is superimposed to the electrode pair, the light emitter radiates light to the electro-optic crystal simultaneously with outputting the drive voltage, and incident light from the gain medium incident along an optical axis perpendicular to a direction of the electric field formed by the control voltage is deflected in a direction parallel to the electric field, so that wavelength sweeping is performed.

* * * * *